United States Patent
Sasaki

(10) Patent No.: US 8,921,923 B2
(45) Date of Patent: Dec. 30, 2014

(54) METHOD FOR MANUFACTURING SEMICONDUCTOR MEMORY DEVICE AND SEMICONDUCTOR MEMORY DEVICE

(71) Applicant: Kabushiki Kaisha Toshiba, Minato-ku, Tokyo (JP)

(72) Inventor: Toshiyuki Sasaki, Mie-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/929,180

(22) Filed: Jun. 27, 2013

(65) Prior Publication Data

US 2014/0264535 A1    Sep. 18, 2014

Related U.S. Application Data

(60) Provisional application No. 61/802,924, filed on Mar. 18, 2013.

(51) Int. Cl.
  *H01L 29/792*    (2006.01)
  *H01L 21/28*     (2006.01)
  *H01L 29/788*    (2006.01)
  *H01L 29/66*     (2006.01)

(52) U.S. Cl.
  CPC ........ *H01L 21/28273* (2013.01); *H01L 29/788* (2013.01); *H01L 29/66833* (2013.01)
  USPC ........... 257/324; 257/314; 257/315; 257/321; 257/E29.129; 257/E29.3

(58) Field of Classification Search
  CPC ............ H01L 29/792; H01L 29/66833; H01L 29/788; H01L 29/66825; H01L 21/28282; H01L 27/11517; H01L 21/76224

USPC ......... 257/288, 314, 315, 317, 321, 322, 324, 257/E29.129, E29.3, E29.302, E21.179, 257/E21.422, E21.423, E21.68
  See application file for complete search history.

(56) References Cited

U.S. PATENT DOCUMENTS

| | | | |
|---|---|---|---|
| 7,692,235 B2 | 4/2010 | Yaegashi | |
| 7,982,259 B2 | 7/2011 | Ichige et al. | |
| 8,154,071 B2 | 4/2012 | Ishii et al. | |
| 2006/0237754 A1 | 10/2006 | Ishida | |
| 2006/0261402 A1* | 11/2006 | Lue et al. | 257/316 |
| 2006/0292802 A1* | 12/2006 | Lee et al. | 438/264 |
| 2009/0309151 A1* | 12/2009 | Sandhu et al. | 257/316 |
| 2010/0213534 A1 | 8/2010 | Sekine et al. | |

FOREIGN PATENT DOCUMENTS

JP    2008-84936    4/2008

* cited by examiner

*Primary Examiner* — Eduardo A Rodela
(74) *Attorney, Agent, or Firm* — Finnegan, Henderson, Farabow, Garrett & Dunner, L.L.P.

(57) ABSTRACT

According to one embodiment, a method for manufacturing a semiconductor memory device includes forming a plurality of charge storage layers each including a lower portion and an upper portion provided on the lower portion and having a smaller width than the lower portion, and a plurality of sacrificial films provided between the upper portions of adjacent ones of the charge storage layers. The sacrificial films are projected higher than the upper portions and spaced by first gaps from sidewalls of the upper portions. The method includes forming a plurality of intermediate insulating films on the upper portions and in the first gaps. The method includes removing the sacrificial films and forming second gaps between adjacent ones of the intermediate insulating films. The method includes forming a control electrode on the intermediate insulating films and in the second gaps.

5 Claims, 18 Drawing Sheets

METHOD FOR MANUFACTURING SEMICONDUCTOR MEMORY DEVICE AND SEMICONDUCTOR MEMORY DEVICE

CROSS-REFERENCE TO RELATED APPLICATION

This application is based upon and claims the benefit of priority from U.S. Provisional Patent Application 61/802,924, filed on Mar. 18, 2013; the entire contents of which are incorporated herein by reference.

FIELD

Embodiments described herein relate generally to a method for manufacturing a semiconductor memory device and a semiconductor memory device.

BACKGROUND

A memory device having the following structure has been put to practical use. A control gate is stacked on a floating gate via an intermediate insulating film. The control gate is provided also on the sidewall of the floating gate via the intermediate insulating film. Thus, the capacitive coupling ratio between the control gate and the floating gate is increased.

With the miniaturization of memory devices, the spacing between the adjacent floating gates is narrowed. Then, there is concern that the space between the adjacent floating gates is filled with the intermediate insulating film. If the space between the adjacent floating gates is filled with the intermediate insulating film having high permittivity, interference between the adjacent cells via the intermediate insulating film is more likely to cause a problem such as varying the threshold.

Furthermore, in order to suppress the intercell interference, the following structure has been proposed. The floating gate is configured to have a protruding shape such that its upper portion has a smaller width than its lower portion. Between the adjacent floating gates, an intermediate insulating film is formed only between the upper portions of the floating gates.

The process for forming an intermediate insulating film only between the upper portions of the floating gates having such a protruding shape is very difficult from the viewpoint of dimensional controllability. Thus, a process having high dimensional controllability is required.

DETAILED DESCRIPTION

Figure 1A:
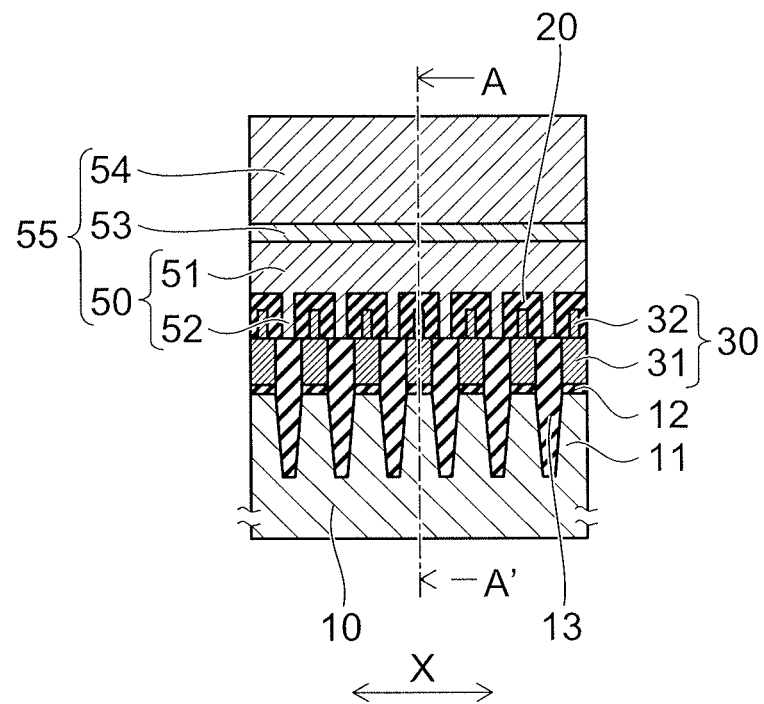
FIG. 1A is a schematic sectional view of a semiconductor memory device of an embodiment.

According to one embodiment, a method for manufacturing a semiconductor memory device includes forming a plurality of charge storage layers each including a lower portion and an upper portion provided on the lower portion and having a smaller width than the lower portion, and a plurality of sacrificial films provided between the upper portions of adjacent ones of the charge storage layers. The sacrificial films are projected higher than the upper portions and spaced by first gaps from sidewalls of the upper portions. The method includes forming a plurality of intermediate insulating films on the upper portions and in the first gaps. The method includes removing the sacrificial films and forming second gaps between adjacent ones of the intermediate insulating films. The method includes forming a control electrode on the intermediate insulating films and in the second gaps.

Various embodiments will be described hereinafter with reference to the accompanying drawings. In the drawings, like components are labeled with like reference numerals.

FIG. 1A is a schematic sectional view of a semiconductor memory device of an embodiment.

Figure 1B:
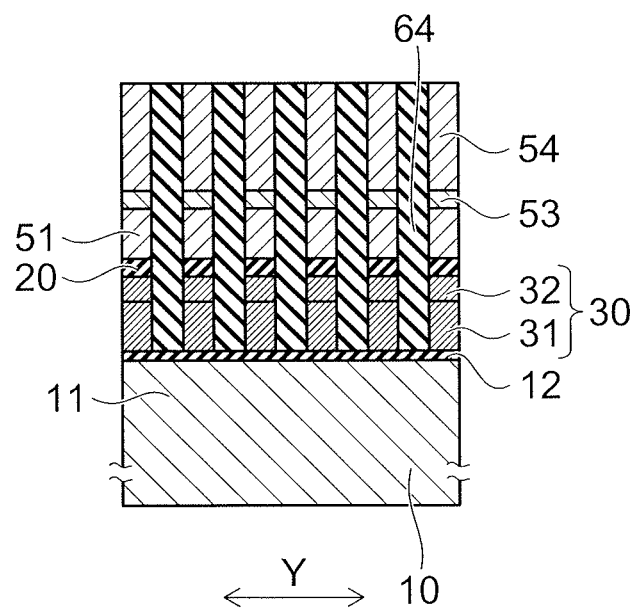
FIG. 1B is a sectional view taken along A-A' in FIG. 1A.

FIG. 1B is a sectional view taken along A-A' in FIG. 1A.

In the surface of a substrate 10, a channel region (or active region) 11 is formed. The substrate 10 is e.g. a silicon substrate.

As shown in FIG. 1A, the channel region 11 is divided into a plurality in a first direction (X direction) by an insulating isolation film 13 provided in a device isolation section.

The device isolation section is e.g. a device isolation section of the STI (shallow trench isolation) structure. The device isolation section has a structure in which the insulating isolation film 13 is provided in a trench formed in the surface of the substrate 10. The insulating isolation film 13 is e.g. a silicon oxide film.

As shown in FIG. 1B, each channel region 11 extends in a second direction (Y direction). The Y direction is a direction crossing (e.g., orthogonal to) the X direction. In FIG. 1A, the Y direction is the direction penetrating through the page.

On the channel region 11, a tunnel insulating film 12 is provided. The tunnel insulating film 12 is e.g. a silicon oxide film.

On the tunnel insulating film 12, a charge storage layer 30 is provided. The charge storage layer 30 is e.g. a floating gate film made of a monolayer or multilayer film containing silicon, titanium, tantalum, tungsten, molybdenum, platinum, ruthenium, or a nitride or carbide thereof.

Alternatively, the charge storage layer 30 is a charge trap film made of a monolayer or multilayer film containing an oxide or nitride of silicon, hafnium, aluminum, lanthanum, or zirconium.

Alternatively, the charge storage layer 30 is a stacked film of a floating gate film and a charge trap film.

The charge storage layer 30 includes a lower portion 31 and an upper portion 32. The lower portion 31 is provided on the tunnel insulating film 12. The upper portion 32 is provided on the lower portion 31. The width in the X direction of the upper portion 32 is smaller than the width in the X direction of the lower portion 31.

As shown in FIG. 1A, the lower portion 31 and the upper portion 32 are divided into a plurality in the X direction. Between the lower portions 31 adjacent in the X direction, the insulating isolation film 13 is provided. Between the upper portions 32 adjacent in the X direction, an intermediate insulating film 20 and part of a control electrode 55 are provided.

Furthermore, as shown in FIG. 1B, the lower portion 31 and the upper portion 32 are divided into a plurality also in the Y direction. An insulating isolation film 64 is provided between the lower portions 31 adjacent in the Y direction and between the upper portions 32 adjacent in the Y direction.

On the charge storage layer 30, the intermediate insulating film 20 is provided. The intermediate insulating film 20 is provided on the top and the sidewall of the upper portion 32 of the charge storage layer 30. The intermediate insulating film 20 is not provided on the sidewall of the lower portion 31 of the charge storage layer 30. On the sidewall of the lower portion 31, the insulating isolation film 13 and the insulating isolation film 64 are provided.

The intermediate insulating film 20 is divided into a plurality in the X direction as shown in FIG. 1A, and divided into a plurality in the Y direction as shown in FIG. 1B.

The intermediate insulating film 20 is made of e.g. a monolayer or multilayer film containing an oxide or nitride of silicon, hafnium, aluminum, lanthanum, or zirconium.

On the intermediate insulating film 20, the control electrode 55 is provided. The control electrode 55 includes a first control electrode 50 and a second control electrode 54 provided on the first control electrode 50. Furthermore, between the first control electrode 50 and the second control electrode 54, a barrier metal film 53 is provided as necessary.

The first control electrode 50 is e.g. a polycrystalline silicon film. The second control electrode 54 is made of a material having lower resistance than the first control electrode 50. The second control electrode 54 is e.g. a metal film such as a tungsten film. The barrier metal film 53 is e.g. a tungsten nitride film.

The first control electrode 50 includes a lower portion 52 and an upper portion 51. The lower portion 52 and the upper portion 51 are integrally provided and made of the same material.

As shown in FIG. 1A, the lower portion 52 is provided to reach the insulating isolation film 13 between the intermediate insulating films 20 adjacent in the X direction.

The intermediate insulating film 20 is not interposed between the lower portion 52 of the first control electrode 50 and the insulating isolation film 13. That is, the intermediate insulating film 20 is divided into a plurality in the X direction on the insulating isolation film 13.

As shown in FIG. 1A, the upper portion 51 of the first control electrode 50 extends in the X direction on the intermediate insulating film 20 and on the lower portion 52. The barrier metal film 53 extends in the X direction on the upper portion 51 of the first control electrode 50. The second control electrode 54 extends in the X direction on the barrier metal film 53.

As shown in FIG. 1B, the charge storage layer 30, the intermediate insulating film 20, the first control electrode 50, the barrier metal film 53, and the second control electrode 54 are divided into a plurality in the Y direction by the insulating isolation film 64. The insulating isolation film 64 is e.g. a silicon oxide film provided in a trench dividing the charge storage layer 30, the intermediate insulating film 20, the first control electrode 50, the barrier metal film 53, and the second control electrode 54 in the Y direction. In the substrate 10 below the insulating isolation film 64, a source/drain section, not shown, made of an impurity diffusion region opposite in conductivity type to the channel region 11 may be provided.

In top view in which the substrate 10 is viewed from above in FIGS. 1A and 1B, the channel region 11 and the control electrode 55 cross (e.g., are orthogonal to) each other. At the crossing portion thereof, the charge storage layer 30 is located. That is, on the substrate 10, a plurality of charge storage layers 30 are laid out like a matrix. Each charge storage layer 30 is provided like a pillar and surrounded with insulator (including void).

Thus, the charge storage layer 30 is covered with insulator and electrically connected to nowhere. Accordingly, even after power-off, electrons stored in the charge storage layer 30 are not leaked from the charge storage layer 30, or no electrons are newly supplied. That is, the semiconductor memory device of the embodiment is a nonvolatile semiconductor memory device capable of retaining data without power supply.

Furthermore, according to the embodiment, the intermediate insulating film 20 is provided not only on the top but also the sidewall of the charge storage layer 30. Furthermore, also on the sidewall of the intermediate insulating film 20, part of the control electrode 55 (the lower portion 52 of the first control electrode 50) is provided. This can increase the capacitive coupling ratio between the charge storage layer 30 and the control electrode 55 via the intermediate insulating film 20. Thus, the voltage such as write voltage can be decreased.

Furthermore, according to the embodiment, the width (width in the X direction) of the upper portion 32 of the charge storage layer 30 is made smaller than that of the lower portion 31. Thus, the distance between the upper portions 32 adjacent in the X direction can be made wider than the distance between the lower portions 31 adjacent in the X direction. This can ensure a space for forming the part of the control electrode 55 (the lower portion 52 of the first control electrode 50) between the intermediate insulating films 20 between the adjacent upper portions 32.

The intermediate insulating film 20 between the upper portions 32 of the adjacent charge storage layers 30 is divided in the X direction by the part of the control electrode 55 (the lower portion 52 of the first control electrode 50). That is, the intermediate insulating films 20 are not connected between the adjacent charge storage layers 30. This can prevent interference between the adjacent cells via the intermediate insulating film 20.

Furthermore, the lower portion 52 of the first control electrode 50 reaches the insulating isolation film 13 without the intermediate insulating film 20 being interposed between the lower portion 52 and the insulating isolation film 13. This can increase the area in which the upper portion 32 of the charge storage layer 30 and the lower portion 52 of the first control electrode 50 are opposed to each other across the intermediate insulating film 20. Thus, the capacitive coupling ratio between the charge storage layer 30 and the first control electrode 50 can be increased.

Next, a method for manufacturing the semiconductor memory device of the embodiment is described.

FIG. 2A to FIG. 7 are schematic sectional views showing the method for manufacturing the semiconductor memory device of the embodiment.

FIG. 2A to FIG. 6A correspond to a cross section taken along the X direction as in FIG. 1A.

Figure 6A:
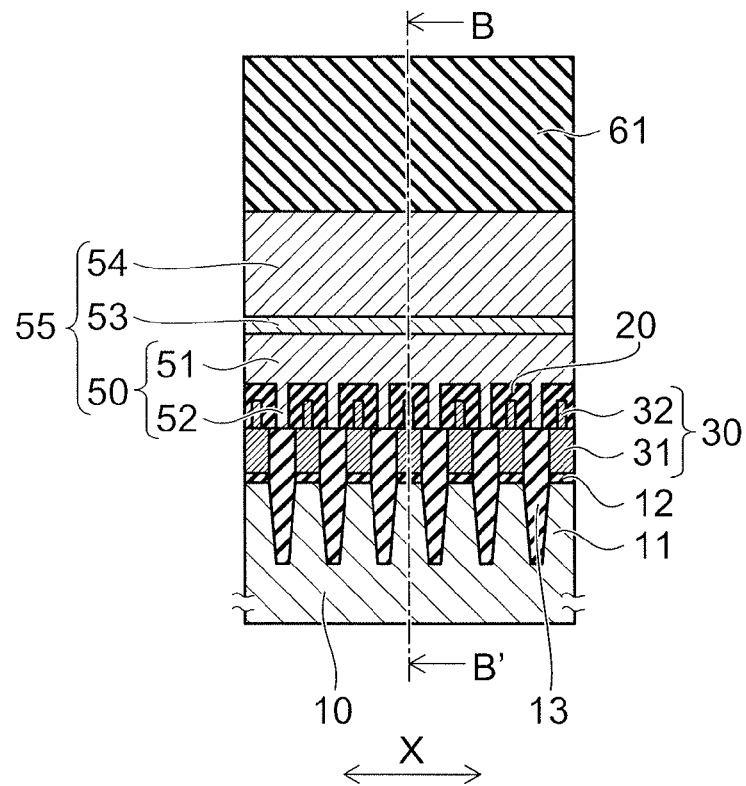
Figure 6B:
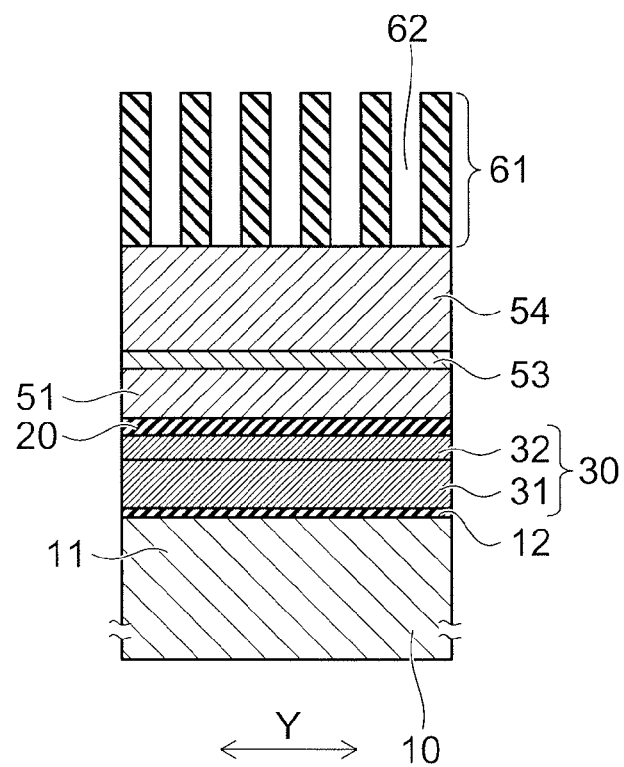
Figure 7:
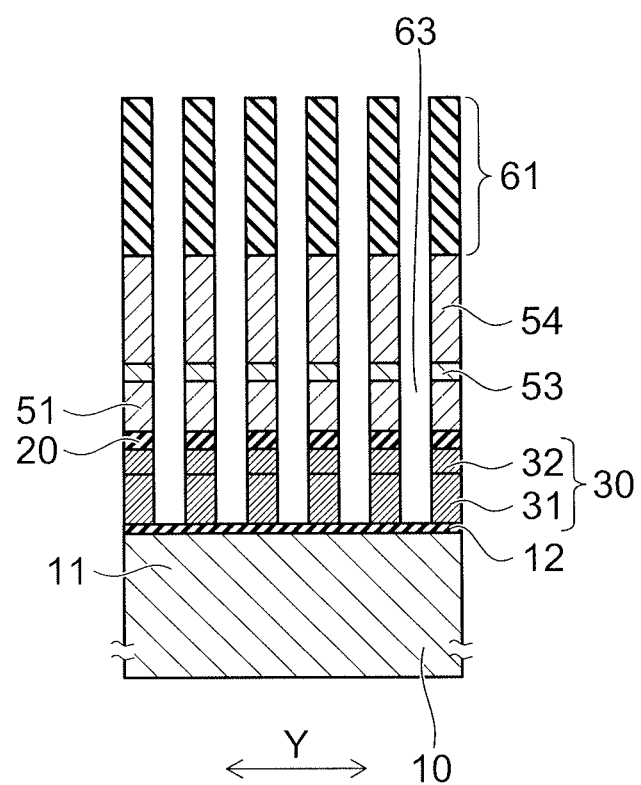

FIG. 6B and FIG. 7 correspond to a cross section taken along the Y direction as in FIG. 1B.

FIG. 6B is a sectional view taken along B-B' in FIG. 6A.

Figure 2A:
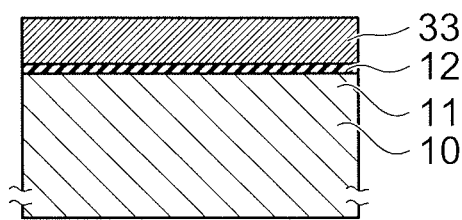
FIG. 2A to FIG. 7 are schematic sectional views showing a method for manufacturing the semiconductor memory device of the embodiment.

As shown in FIG. 2A, the tunnel insulating film 12 is formed on the channel region 11 in the surface of the substrate 10. A charge storage material film 33 is formed on the tunnel insulating film 12. This charge storage material film 33 constitutes the lower portion 31 of the charge storage layer 30 later.

Figure 2B:
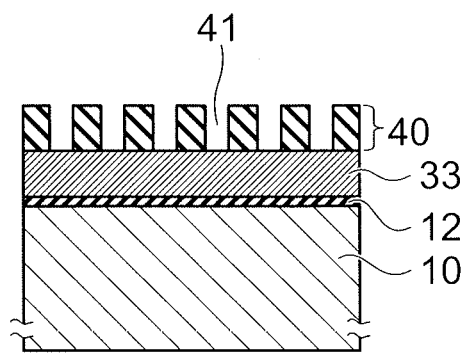

As shown in FIG. 2B, on the charge storage material film 33, a mask layer 40 is formed. The mask layer 40 includes a plurality of openings 41 arranged in the X direction. The mask layer 40 is e.g. a silicon nitride film.

Figure 2C:
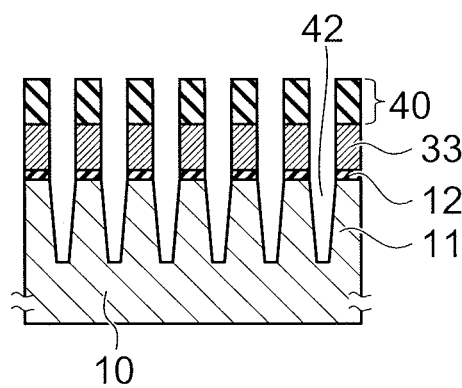

Then, as shown in FIG. 2C, by e.g. RIE (reactive ion etching) method using the mask layer 40 as a mask, a plurality of trenches 42 are formed. By the trenches 42, the channel region 11, the tunnel insulating film 12, and the charge storage material film 33 are divided into a plurality in the X direction.

Figure 2D:
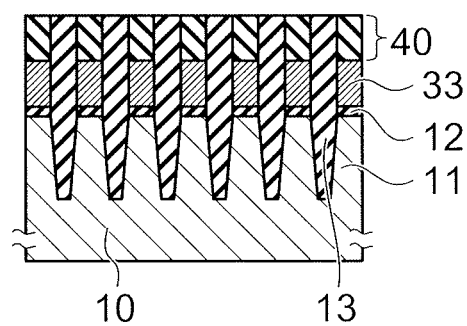

After the trenches 42 are formed, as shown in FIG. 2D, an insulating isolation film 13 is buried in the trench 42. The insulating isolation film 13 is buried also in the opening 41 of the mask layer 40. The insulating isolation film 13 is a film dissimilar to the mask layer 40. The insulating isolation film 13 is e.g. a silicon oxide film.

The insulating isolation film 13 deposited on the mask layer 40 is removed and planarized by e.g. CMP (chemical mechanical polishing) method.

Figure 3A:
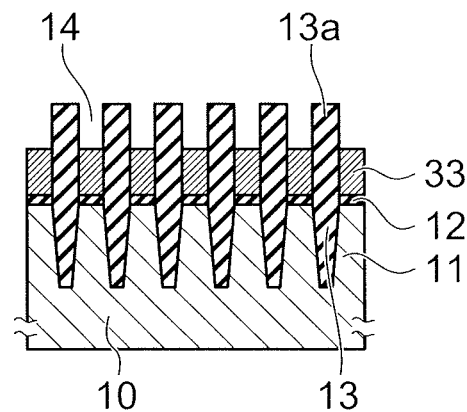

Next, the mask layer 40 is removed by e.g. wet processing using hot phosphoric acid. As shown in FIG. 3A, this results in a structure in which a part of the insulating isolation film 13 is projected higher than the charge storage material film 33 as a sacrificial film 13a to be removed in a later step.

Figure 3B:
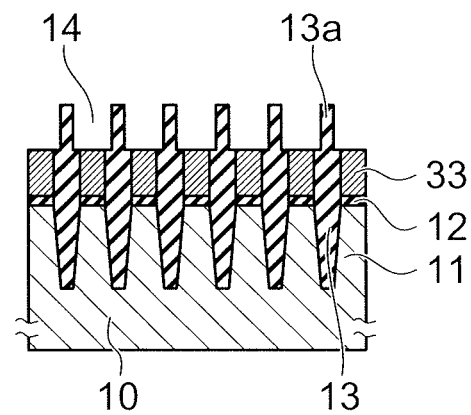

Next, the sacrificial film 13a is slimmed. For instance, as shown in FIG. 3B, by wet processing, the width (width in the X direction) of the sacrificial film 13a is reduced. A gap 14 between the sacrificial films 13a adjacent in the X direction is made wider than that before slimming of the sacrificial films 13a shown in FIG. 3A.

Figure 3C:
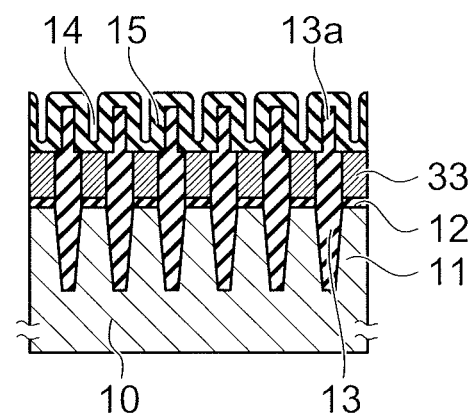

Next, as shown in FIG. 3C, on the charge storage material film 33, a sidewall film 15 is formed so as to cover the sacrificial film 13a. The sidewall film 15 is a film dissimilar to the sacrificial film 13a. The sidewall film 15 is e.g. a silicon nitride film.

The sidewall film 15 is conformally formed along the upper surface of the charge storage material film 33, the sidewall of the sacrificial film 13a and the upper surface of the sacrificial film 13a.

Figure 4A:
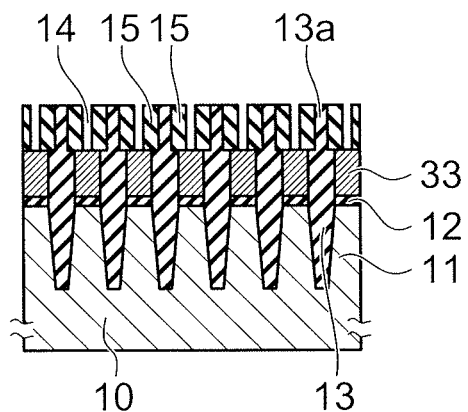

Then, by e.g. RIE method, the sidewall film 15 deposited on the charge storage material film 33 is removed. As shown in FIG. 4A, the sidewall film 15 is left on the sidewall of the sacrificial film 13a. The gap 14 is formed on the charge storage material film 33 between the sidewall films 15 adjacent in the X direction.

Figure 4B:
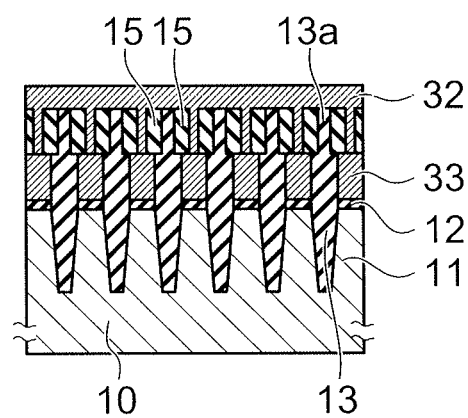
Figure 4C:
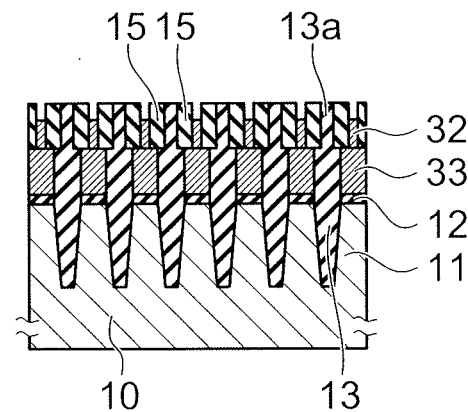

As shown in FIG. 4B, the upper portion 32 of the charge storage layer 30 is buried in the gap 14. The material film of the upper portion 32 of the charge storage layer 30 is deposited also on the sidewall film 15 and on the sacrificial film 13a. Then, by e.g. RIE method, the material film of the upper portion 32 of the charge storage layer 30 is etched back. Thus, the material film of the upper portion 32 deposited on the sidewall film 15 and on the sacrificial film 13a is removed. Furthermore, the upper end of the upper portion 32 of the charge storage layer 30 buried in the gap 14 is set back below (on the substrate 10 side of) the upper end of the sidewall film 15 and the upper end of the sacrificial film 13a. Thus, the upper end of the upper portion 32 of the charge storage layer 30 is made lower than the upper end of the sacrificial film 13a.

Next, the sidewall film 15 is removed by e.g. wet processing using hot phosphoric acid. This results in a structure shown in FIG. 5A.

That is, the charge storage layer 30 made of the lower portion 31 and the upper portion 32 having a smaller width than the lower portion 31 is formed. Furthermore, between the adjacent upper portions 32, the sacrificial film 13a projected higher than the upper portion 32 is formed. Between the sidewall of the upper portion 32 and the sidewall of the sacrificial film 13a, a gap (first gap) 16 is formed. Between the adjacent lower portions 31, the insulating isolation film 13 is buried.

Figure 5A:
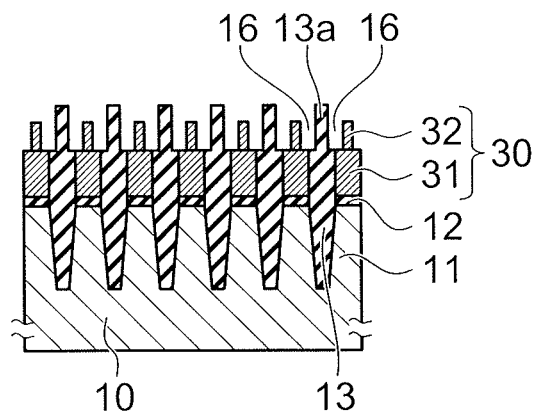
Figure 5B:
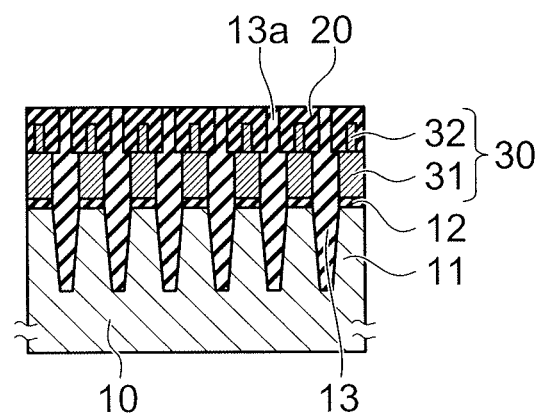

As shown in FIG. 5B, an intermediate insulating film 20 is formed on the charge storage layer 30, on the sacrificial film 13a, and in the gap 16. The intermediate insulating film 20 is planarized by e.g. CMP method, RIE method, or wet processing. The intermediate insulating film 20 on the sacrificial film 13a is removed, and the upper end of the sacrificial film 13a is exposed from the intermediate insulating film 20. The intermediate insulating film 20 on the upper portion 32 of the charge storage layer 30 and in the gap 16 is left.

Figure 5C:
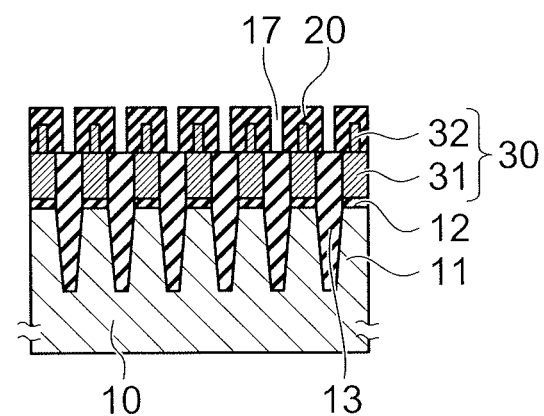

Then, the sacrificial film 13a is removed by e.g. wet processing. Thus, as shown in FIG. 5C, a gap (second gap) 17 is formed between the adjacent intermediate insulating films 20.

Next, as shown in FIG. 6A, the first control electrode 50 is formed in the gap 17 and on the intermediate insulating film 20. In the gap 17, the part (the lower portion 52) of the first control electrode 50 is buried.

On the first control electrode 50, a second control electrode 54 is formed via a barrier metal film 53.

On the second control electrode 54, a mask layer 61 is formed. The mask layer 61 is e.g. a silicon nitride film.

As shown in FIG. 6B being a sectional view taken along B-B' in FIG. 6A, the mask layer 61 includes a plurality of openings 62 arranged in the Y direction. By using the mask layer 61 as a mask, the stacked body below the mask layer 61 is etched by e.g. RIE method.

Thus, as shown in FIG. 7, trenches 63 dividing the charge storage layer 30, the intermediate insulating film 20, the first control electrode 50, the barrier metal film 53, and the second control electrode 54 into a plurality in the Y direction are formed. The charge storage layer 30 is processed into a pillar. An impurity diffusion region constituting a source/drain section is formed as necessary in the substrate 10 below the trench 63. Then, as shown in FIG. 1B, the insulating isolation film 64 is buried in the trench 63.

According to the embodiment described above, as shown in FIG. 5A, a sacrificial film 13a is formed between the adjacent upper portions 32. The sacrificial film 13a is projected higher than the upper portion 32 of the charge storage layer 30. The sacrificial film 13a is spaced by the gap 16 from the sidewall of the upper portion 32. Thus, by the sacrificial film 13a, the intermediate insulating film 20 provided on the sidewall of the upper portion 32 is separated from the intermediate insulating film 20 provided on the sidewall of the adjacent upper portion 32. Furthermore, by the sacrificial film 13a projected higher than the upper portion 32, the intermediate insulating film 20 provided on the upper portion 32 is separated from the intermediate insulating film 20 provided on the adjacent upper portion 32.

That is, according to the embodiment, the intermediate insulating film 20 can be formed with high dimensional accuracy and in a self-aligned manner only on the sidewall and the upper surface of the upper portion 32 having a smaller width than the lower portion 31. The intermediate insulating film 20 can be reliably separated from the intermediate insulating film 20 provided on the adjacent upper portion 32. This can suppress interference between the adjacent cells.

Furthermore, in the method of the embodiment described above, the lower portion 31 and the upper portion 32 of the charge storage layer 30 can be formed from different materials. Naturally, the lower portion 31 and the upper portion 32 may be made of the same material.

Figure 8A:
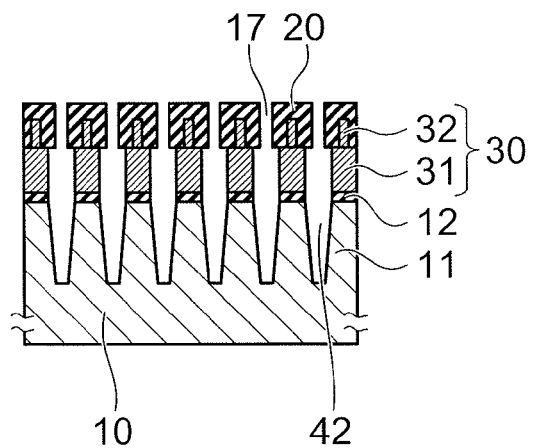
FIG. 8A and FIG. 8B are schematic sectional views showing a method for manufacturing a semiconductor memory device of another embodiment.

After the step of FIG. 5C in which the sacrificial film 13a has been removed, the insulating isolation film 13 can be removed through the gap 17. Then, as shown in FIG. 8A, an air gap can be formed between the lower portions 31 of the adjacent charge storage layers 30.

Figure 8B:
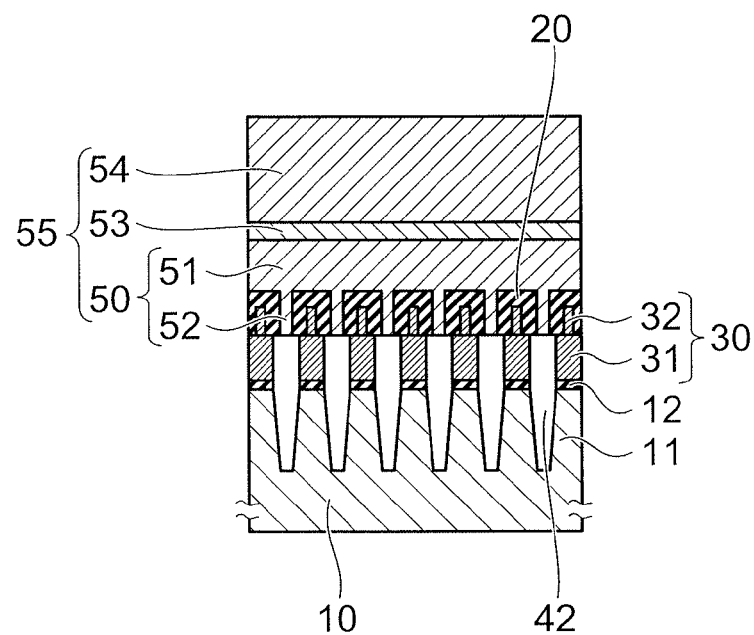

The gap 17 is narrow. Thus, by controlling the film formation condition of the first control electrode 50, as shown in FIG. 8B, the air gap between the lower portions 31 of the charge storage layers 30 can be maintained.

The intermediate insulating film 20 may be either a monolayer or multilayer film.

Figure 9A:
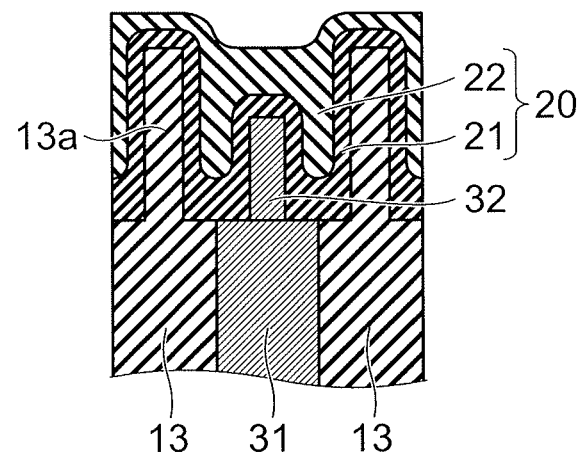
FIG. 9A and FIG. 9B are schematic sectional views showing a method for manufacturing a semiconductor memory device of another embodiment.

FIG. 9A shows a formation method in the case where the intermediate insulating film 20 has e.g. a stacked structure of dissimilar films.

After the aforementioned step of FIG. 5A, first, a first film 21 is formed. The first film 21 is conformally formed along the sidewall of the sacrificial film 13a, the upper surface of the sacrificial film 13a, the sidewall of the upper portion 32 of the charge storage layer 30, the upper surface of the upper portion 32, and the bottom portion of the region between the sidewall of the sacrificial film 13a and the sidewall of the upper portion 32.

In the region between the sidewall of the sacrificial film 13a and the sidewall of the upper portion 32, the first film 21 is formed in a U-shaped cross section.

After the first film 21 is formed, a second film 22 is formed on the first film 21.

Figure 9B:
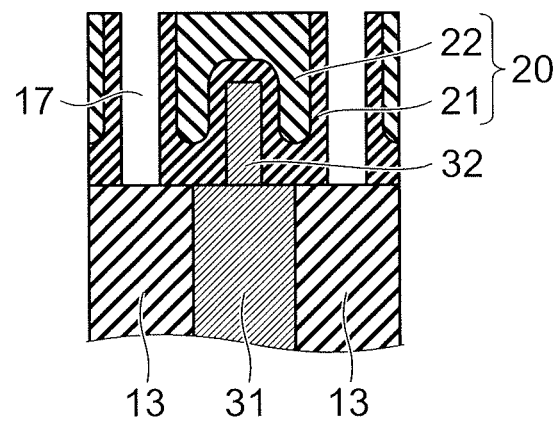

The upper surface of the intermediate insulating film 20 including the first film 21 and the second film 22 is planarized. After the upper surface of the sacrificial film 13a is exposed, the sacrificial film 13a is removed. Thus, as shown in FIG. 9B, a gap 17 is formed adjacent to the sidewall of the first film 21 having a U-shaped cross section on the opposite side from the sidewall in contact with the upper portion 32.

Figure 10:
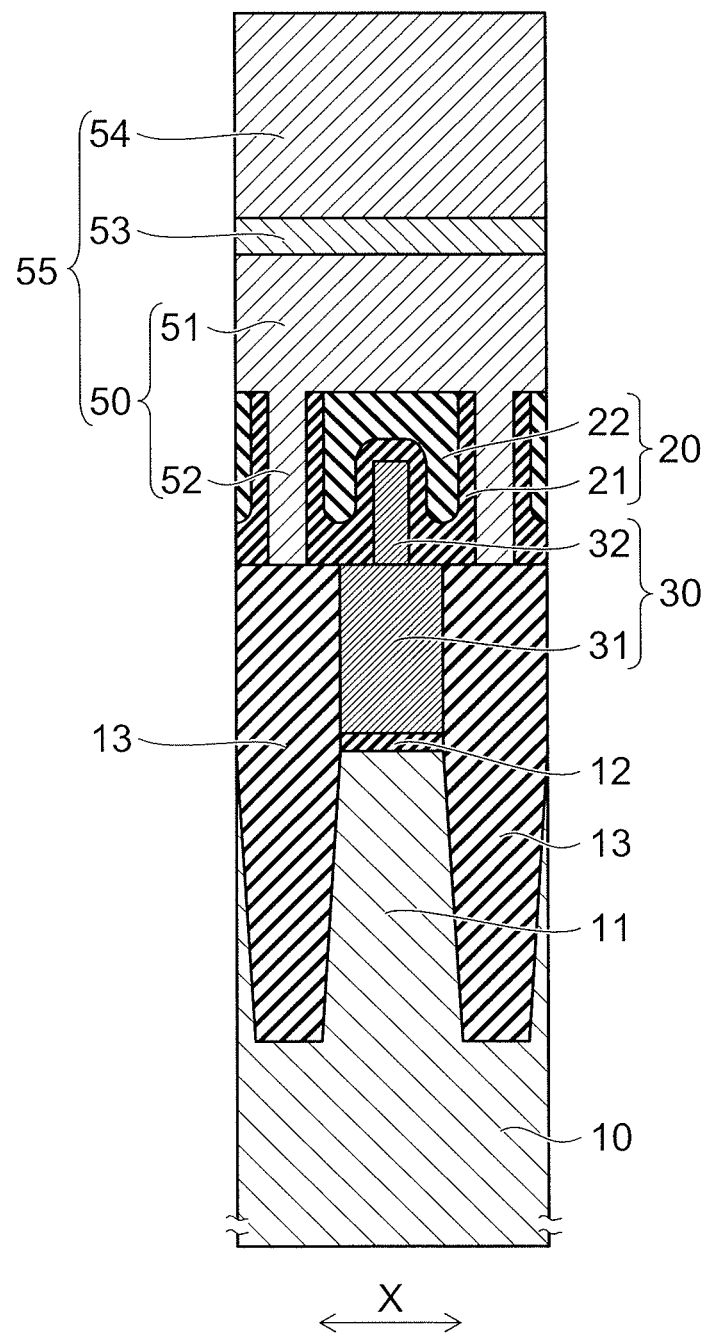
FIG. 10 is a schematic sectional view of a semiconductor memory device of another embodiment.

In the gap 17, like the above embodiment, as shown in FIG. 10, the part (the lower portion 52) of the first control electrode 50 is buried. Then, on the first control electrode 50, a second control electrode 54 is formed via a barrier metal film 53.

For instance, the first film 21 is a silicon oxide film, and the second film 22 is a silicon nitride film. Alternatively, the first film 21 is a silicon oxide film or silicon nitride film, and the second film 22 is a $HfO_2$ film or HfSiO film. At least one of the first film 21 and the second film 22 may be made of a film of a plurality of dissimilar layers.

The first film 21 is continuously provided on the bottom portion of the region between the sidewall of the upper portion 32 of the charge storage layer 30 and the sidewall of the lower portion 52 of the first control electrode 50, the sidewall of the upper portion 32 of the charge storage layer 30, and the sidewall of the lower portion 52 of the first control electrode 50.

The second film 22 is provided on the first film 21. The second film 22 is provided inside the first film 21 formed in a U-shaped cross section in the region between the lower portion 52 of the first control electrode 50 and the upper portion 32 of the charge storage layer 30.

A stacked film is provided between the lower portion 52 of the first control electrode 50 and the upper portion 32 of the charge storage layer 30. The stacked film includes the first film 21 provided on the sidewall of the lower portion 52 of the first control electrode 50, the first film 21 provided on the sidewall of the upper portion 32 of the charge storage layer 30, and the second film 22 sandwiched between these first films 21.

The lower portion 52 of the first control electrode 50 reaches the insulating isolation film 13 without the intermediate insulating film 20 being interposed between the lower portion 52 and the insulating isolation film 13. Thus, the lower portion 52 divides the intermediate insulating film 20 in the X direction.

Next, with reference to FIG. 11A to FIG. 16, an alternative example of the method for manufacturing a semiconductor memory device of the embodiment is described.

FIG. 11A to FIG. 15A correspond to a cross section taken along the X direction as in FIG. 1A.

Figure 15A:
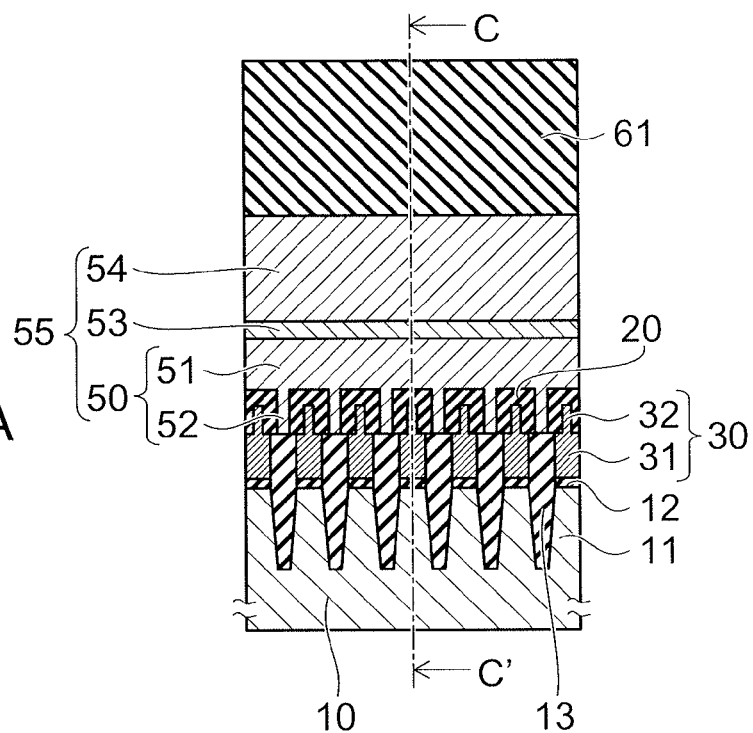
Figure 15B:
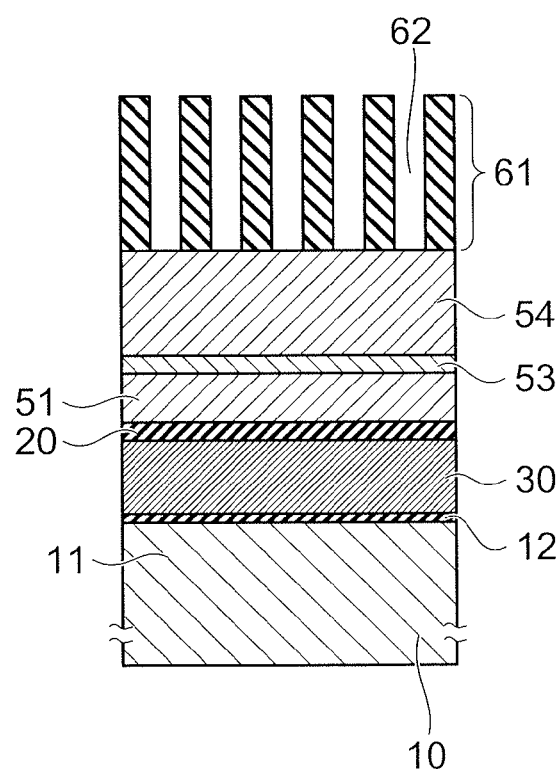
Figure 16:
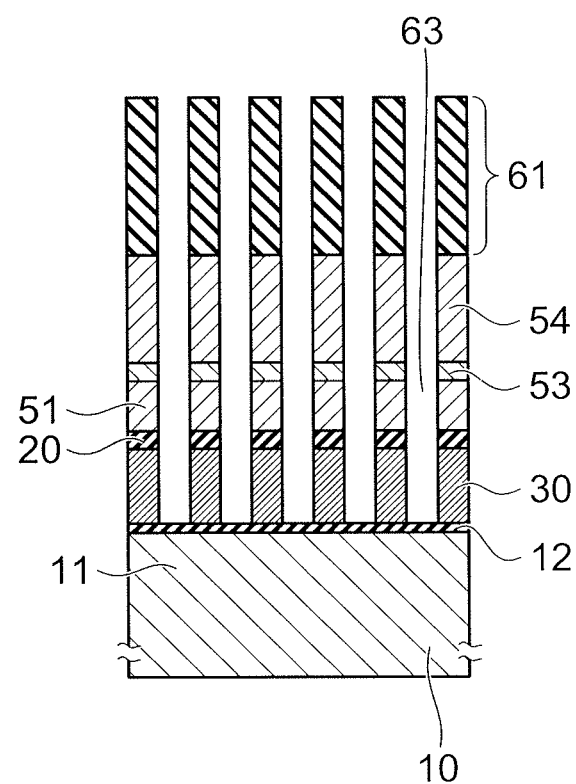

FIG. 15B and FIG. 16 correspond to a cross section taken along the Y direction as in FIG. 1B.

FIG. 15B is a sectional view taken along C-C' in FIG. 15A.

Figure 11A:
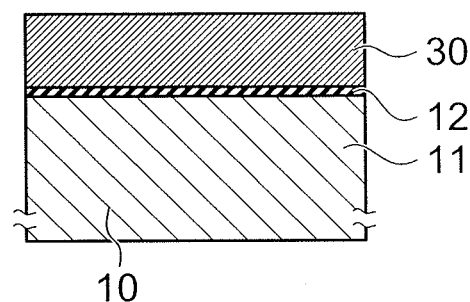
FIG. 11A to FIG. 18C are schematic sectional views showing a method for manufacturing a semiconductor memory device of another embodiment.

As shown in FIG. 11A, the tunnel insulating film 12 is formed on the channel region 11 in the surface of the substrate 10. The charge storage material film constituting the charge storage layer 30 is formed on the tunnel insulating film 12.

Figure 11B:
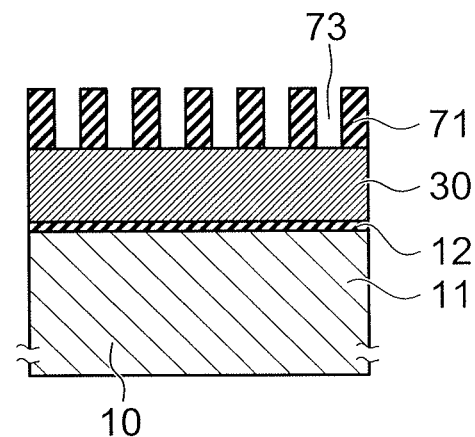

As shown in FIG. 11B, on the charge storage layer 30, a core film 71 is formed. A plurality of core films 71 are arranged in the X direction via openings 73. The core film 71 is e.g. a silicon oxide film.

Figure 11C:
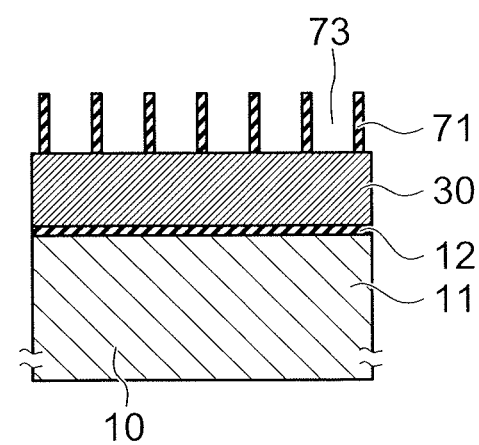

Next, the core film 71 is slimmed. For instance, as shown in FIG. 11C, by wet processing, the width (width in the X direction) of the core film 71 is reduced. The width of the opening 73 is made wider than that before slimming shown in FIG. 11B.

Figure 12A:
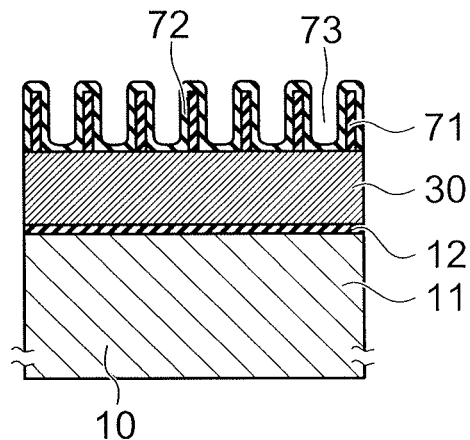

Next, as shown in FIG. 12A, on the charge storage layer 30, a spacer film 72 is formed so as to cover the core film 71. The spacer film 72 is a film dissimilar to the core film 71. The spacer film 72 is e.g. a silicon nitride film.

The spacer film 72 is conformally formed along the upper surface of the charge storage layer 30, the sidewall of the core film 71 and the upper surface of the core film 71.

Figure 12B:
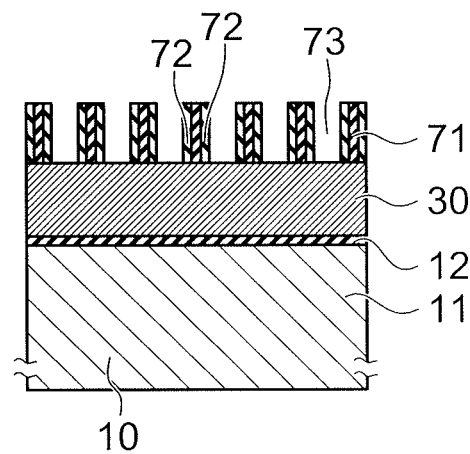

Then, by e.g. RIE method, the spacer film 72 deposited on the charge storage layer 30 is removed. As shown in FIG. 12B, the spacer film 72 is left on the sidewall of the core film 71. A gap 73 is formed on the charge storage layer 30 between the spacer films 72 adjacent in the X direction.

Figure 12C:
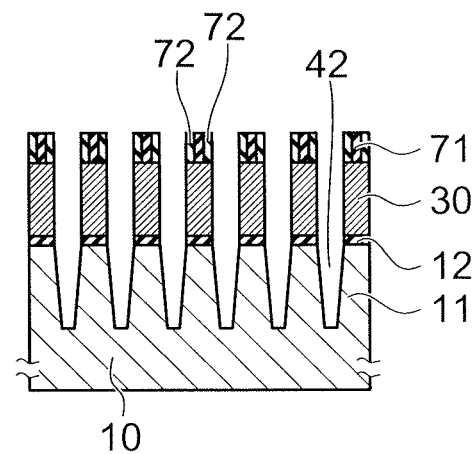

Then, as shown in FIG. 12C, by e.g. RIE method using the core film 71 and the spacer films 72 as a mask layer, a plurality of trenches 42 are formed. By the trenches 42, the channel region 11, the tunnel insulating film 12, and the charge storage layer 30 are divided into a plurality in the X direction.

Figure 13A:
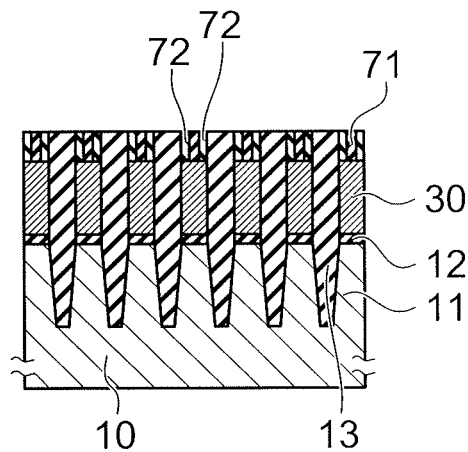

After the trenches 42 are formed, as shown in FIG. 13A, an insulating isolation film 13 is buried in the trench 42. The insulating isolation film 13 is buried also between the mask layers made of the stacked film of the core film 71 and the spacer films 72. The insulating isolation film 13 deposited on the mask layer is removed and planarized by e.g. CMP method.

Figure 13B:
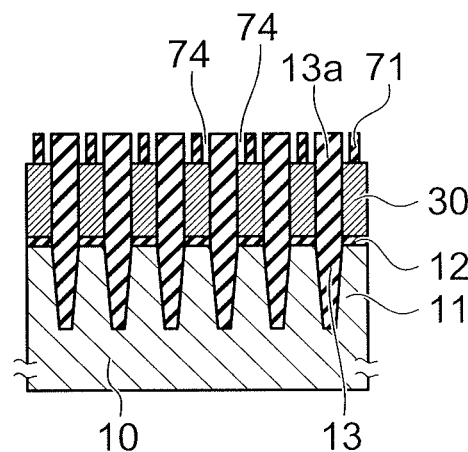

Next, the spacer film 72 is removed by e.g. wet processing using hot phosphoric acid. As shown in FIG. 13B, this results in a structure in which a part of the insulating isolation film 13 is projected higher than the charge storage layer 30 as a sacrificial film 13a to be removed in a later step. A gap 74 is formed between the sidewall of the core film 71 left on the charge storage layer 30 and the sidewall of the sacrificial film 13a.

Figure 13C:
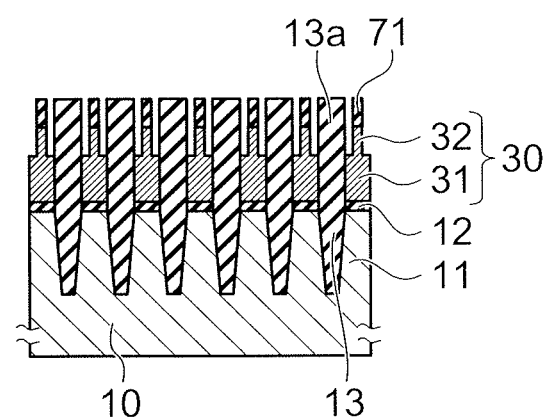

Next, by e.g. RIE method using the core film 71 as a mask, the upper portion of the charge storage layer 30 is processed. Thus, as shown in FIG. 13C, the charge storage layer 30 is processed into a configuration including the lower portion 31 and the upper portion 32 having a smaller width than the lower portion 31.

Figure 14A:
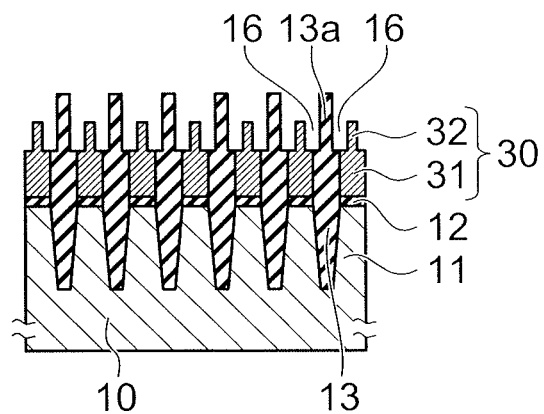

Next, the core film 71 is removed by e.g. wet processing. The core film 71 and the sacrificial film 13a are e.g. the same silicon oxide film. Thus, by the wet processing for removing the core film 71, the sacrificial film 13a is also etched. Accordingly, as shown in FIG. 14A, the width of the sacrificial film 13a is reduced.

A gap 16 is formed between the sidewall of the upper portion 32 of the charge storage layer 30 and the sidewall of the sacrificial film 13a. The upper end of the sacrificial film 13a is not set back to a position lower than the upper end of the upper portion 32 of the charge storage layer 30. The upper end of the sacrificial film 13a is projected higher than the upper end of the upper portion 32 of the charge storage layer 30.

That is, the charge storage layer 30 made of the lower portion 31 and the upper portion 32 having a smaller width than the lower portion 31 is formed. Furthermore, between the adjacent upper portions 32, the sacrificial film 13a projected higher than the upper portion 32 is formed.

Figure 14B:
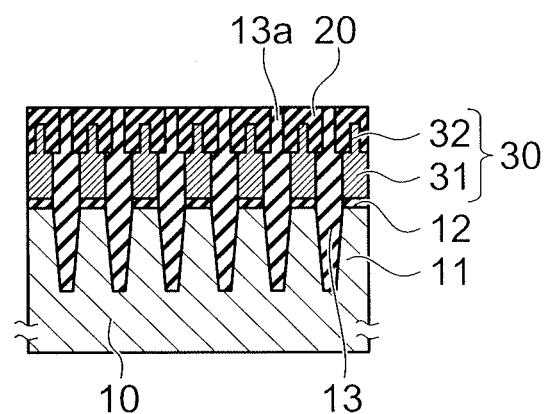

As shown in FIG. 14B, the intermediate insulating film 20 is formed on the charge storage layer 30, on the sacrificial film 13a, and in the gap 16. The intermediate insulating film 20 is planarized by e.g. CMP method, RIE method, or wet processing. The intermediate insulating film 20 on the sacrificial film 13a is removed, and the upper end of the sacrificial film 13a is exposed from the intermediate insulating film 20. The intermediate insulating film 20 on the upper portion 32 of the charge storage layer 30 and in the gap 16 is left.

Figure 14C:
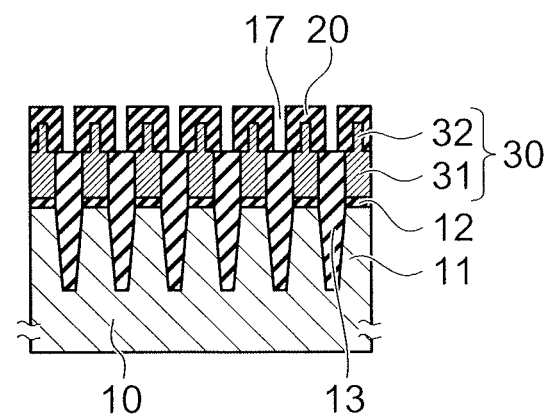

Then, the sacrificial film 13a is removed by e.g. wet processing. Thus, as shown in FIG. 14C, a gap (second gap) 17 is formed between the adjacent intermediate insulating films 20.

Next, as shown in FIG. 15A, in the gap 17 and on the intermediate insulating film 20, a first control electrode 50 is formed. In the gap 17, the part (the lower portion 52) of the first control electrode 50 is buried.

On the first control electrode 50, a second control electrode 54 is formed via a barrier metal film 53.

On the second control electrode 54, a mask layer 61 is formed. The mask layer 61 is e.g. a silicon nitride film.

As shown in FIG. 15B being a sectional view taken along C-C' in FIG. 15A, the mask layer 61 includes a plurality of openings 62 arranged in the Y direction. By using the mask layer 61 as a mask, the stacked body below the mask layer 61 is etched by e.g. RIE method.

Thus, as shown in FIG. 16, trenches 63 dividing the charge storage layer 30, the intermediate insulating film 20, the first control electrode 50, the barrier metal film 53, and the second control electrode 54 into a plurality in the Y direction are formed. The charge storage layer 30 is processed into a pillar. An impurity diffusion region constituting a source/drain section is formed as necessary in the substrate 10 below the trench 63. Then, as shown in FIG. 1B, the insulating isolation film 64 is buried in the trench 63.

According to the embodiment described above, as shown in FIG. 14A, the sacrificial film 13a is formed between the adjacent upper portions 32. The sacrificial film 13a is projected higher than the upper portion 32 of the charge storage layer 30. The sacrificial film 13a is spaced by the gap 16 from the sidewall of the upper portion 32. Thus, by the sacrificial film 13a, the intermediate insulating film 20 provided on the sidewall of the upper portion 32 is separated from the intermediate insulating film 20 provided on the sidewall of the adjacent upper portion 32. Furthermore, by the sacrificial film 13a projected higher than the upper portion 32, the intermediate insulating film 20 provided on the upper portion 32 is separated from the intermediate insulating film 20 provided on the adjacent upper portion 32.

That is, the intermediate insulating film 20 can be formed with high dimensional accuracy and in a self-aligned manner only on the sidewall and the upper surface of the upper portion 32 having a smaller width than the lower portion 31. The intermediate insulating film 20 can be reliably separated from the intermediate insulating film 20 provided on the adjacent upper portion 32. This can suppress interference between the adjacent cells.

Next, with reference to FIG. 17A to FIG. 18C, a further alternative example of the method for manufacturing a semiconductor memory device of the embodiment is described.

FIG. 17A to FIG. 18C correspond to a cross section taken along the X direction as in FIG. 1A.

The steps shown in FIGS. 11A to 11C are performed similarly to the above embodiment. Then, before forming a device isolation section, the charge storage layer 30 is processed previously.

Figure 17A:
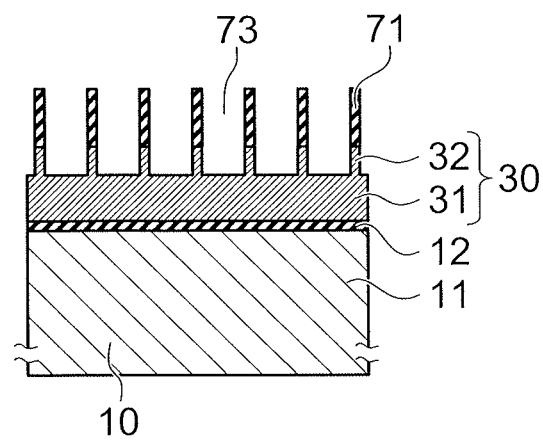

That is, as shown in FIG. 17A, by e.g. RIE method using the core film 71 slimmed in width as a mask, the charge storage layer 30 is processed into a configuration including the lower portion 31 and the upper portion 32 having a smaller width than the lower portion 31.

Figure 17B:
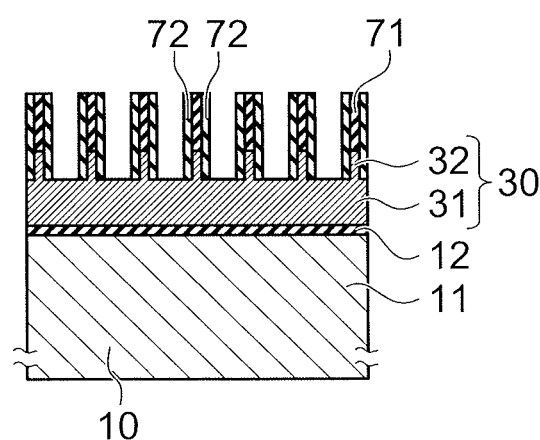

Next, as shown in FIG. 17B, with the core film 71 left on the upper portion 32 of the charge storage layer 30, a spacer film 72 is formed on the sidewall of the upper portion 32 and the sidewall of the core film 71. The spacer film 72 is conformally formed so as to cover the upper portion 32 and the core film 71. Then, the spacer film 72 deposited on the lower portion 31 of the charge storage layer 30 is removed by e.g. RIE method.

Figure 17C:
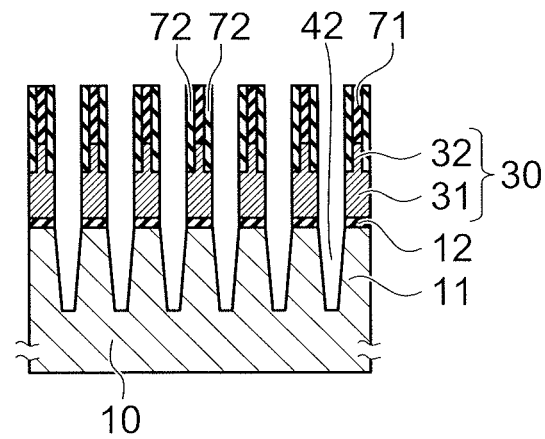

Next, as shown in FIG. 17C, by e.g. RIE method using the core film 71 and the spacer films 72 as a mask layer, a plurality of trenches 42 are formed. By the trenches 42, the channel region 11, the tunnel insulating film 12, and the charge storage layer 30 are divided into a plurality in the X direction.

Figure 18A:
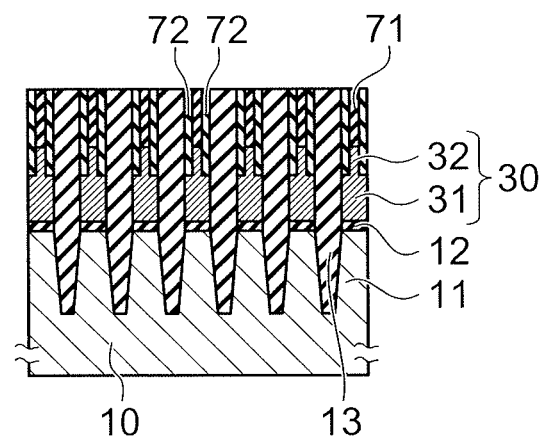

After the trenches 42 are formed, as shown in FIG. 18A, the insulating isolation film 13 is buried in the trench 42. The insulating isolation film 13 is buried also between the spacer films 72 adjacent in the X direction. The insulating isolation film 13 deposited on the mask layer is removed and planarized by e.g. CMP method.

Figure 18B:
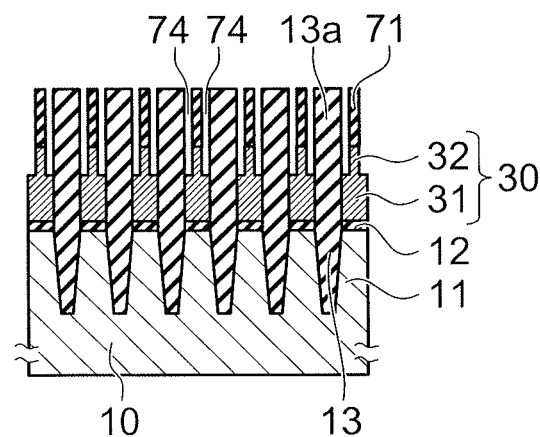

Next, the spacer film 72 is removed by e.g. wet processing using hot phosphoric acid. As shown in FIG. 18B, this results in a structure in which a part of the insulating isolation film 13 is projected higher than the charge storage layer 30 as the sacrificial film 13a to be removed in a later step. A gap 74 is formed between the upper portion 32 of the charge storage layer 30 and the sacrificial film 13a, and between the core film 71 and the sacrificial film 13a.

Figure 18C:
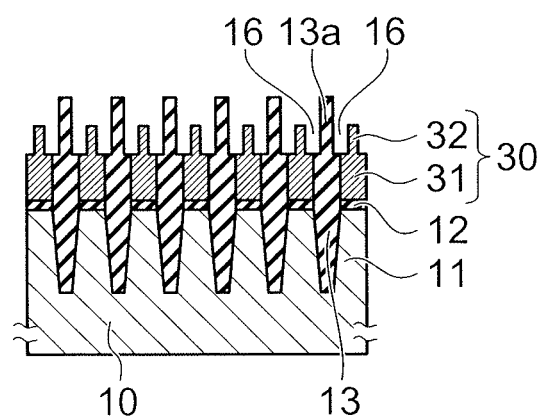

Next, the core film 71 is removed by e.g. wet processing. The core film 71 and the sacrificial film 13a are e.g. the same silicon oxide film. Thus, by the wet processing for removing the core film 71, the sacrificial film 13a is also etched. Accordingly, as shown in FIG. 18C, the width of the sacrificial film 13a is reduced.

A gap 16 is formed between the sidewall of the upper portion 32 of the charge storage layer 30 and the sidewall of the sacrificial film 13a. The upper end of the sacrificial film 13a is not set back to a position lower than the upper end of the upper portion 32 of the charge storage layer 30. The upper end of the sacrificial film 13a is projected higher than the upper end of the upper portion 32 of the charge storage layer 30.

That is, the charge storage layer 30 made of the lower portion 31 and the upper portion 32 having a smaller width than the lower portion 31 is formed. Furthermore, between the adjacent upper portions 32, the sacrificial film 13a projected higher than the upper portion 32 is formed.

Subsequently, the aforementioned steps shown in FIG. 14B to FIG. 16 are continued.

Also in this embodiment, as shown in FIG. 18C, the sacrificial film 13a is formed between the adjacent upper portions 32. The sacrificial film 13a is projected higher than the upper portion 32 of the charge storage layer 30. The sacrificial film 13a is spaced by the gap 16 from the sidewall of the upper portion 32. Thus, by the sacrificial film 13a, the intermediate insulating film 20 provided on the sidewall of the upper portion 32 is separated from the intermediate insulating film 20 provided on the sidewall of the adjacent upper portion 32. Furthermore, by the sacrificial film 13a projected higher than the upper portion 32, the intermediate insulating film 20 provided on the upper portion 32 is separated from the intermediate insulating film 20 provided on the adjacent upper portion 32.

That is, the intermediate insulating film 20 can be formed with high dimensional accuracy and in a self-aligned manner only on the sidewall and the upper surface of the upper portion 32 having a smaller width than the lower portion 31. The intermediate insulating film 20 can be reliably separated from the intermediate insulating film 20 provided on the adjacent upper portion 32. This can suppress interference between the adjacent cells.

While certain embodiments of the invention have been described, these embodiments have been presented by way of example, and are not intended to limit the scope of the invention. For instance, the introduction of the air gap between the lower portions of the charge storage layers as shown in FIGS. 8A and 8B, and the formation of the intermediate insulating film from a multilayer film as shown in FIG. 9A to FIG. 10, are also applicable to the embodiment described with reference to FIG. 11A to FIG. 16 or FIG. 17A to FIG. 18C. These novel embodiments can be embodied in a variety of other forms. Furthermore, various omissions, substitutions, and changes can be made without departing from the spirit of the invention. These embodiments and the variations thereof are encompassed within the scope and spirit of the invention, and also encompassed within the scope of the invention described in the claims and the equivalents thereof.

What is claimed is:

1. A semiconductor memory device comprising:
   a substrate including a channel region in a surface;
   a tunnel insulating film provided on the channel region;
   a plurality of charge storage layers provided on the tunnel insulating film, and each including a lower portion and an upper portion provided on the lower portion and having a smaller width than the lower portion;
   a plurality of device isolation sections provided between the lower portions of adjacent ones of the charge storage layers;
   a plurality of intermediate insulating films provided on the upper portions of the charge storage layers and on sidewalls of the upper portions, and divided above the device isolation sections; and
   a control electrode including an upper portion provided on the intermediate insulating films, and a plurality of lower portions provided between adjacent ones of the intermediate insulating films and reaching the device isolation sections without the intermediate insulating films being interposed between the lower portions and the device isolation sections,
   wherein
   each of the intermediate insulating films has a stacked structure of dissimilar films,
   the dissimilar films include:
      a first film continuously provided on a bottom portion of a region between the sidewall of the upper portion of the charge storage layer and a sidewall of the lower portion of the control electrode, on the sidewall of the upper portion of the charge storage layer, and on the sidewall of the lower portion of the control electrode, and
      a second film provided on the first film,
   the second film and the first film are provided between the upper portion of the control electrode and a to of the upper portion of the change storage layer, and
   the first film is provided between the second film and the top of the upper portion of the charge storage layer.

2. The device according to claim 1, wherein a height of a top of the first film provided on the sidewall of the lower portion of the control electrode is higher than a height of a top of the first film provided on the sidewall of the upper portion of the charge storage layer.

3. The device according to claim 1, wherein the second film is provided in a region enclosed by the first film provided on the bottom portion between the sidewall of the upper portion of the charge storage layer and the sidewall of the lower portion of the control electrode, the sidewall of the upper portion of the charge storage layer, and the sidewall of the lower portion of the control electrode.

4. The device according to claim 3, wherein the second film is not in contact with the charge storage layer and the device isolation section.

5. The device according to claim 1, wherein the second film is in contact with the upper portion of the control electrode, and is not in contact with the lower portion of the control electrode.

* * * * *